United States Patent [19]

Grabis

[11] Patent Number: 4,825,090
[45] Date of Patent: Apr. 25, 1989

[54] SHIELDING MEMBRANE

[76] Inventor: Dietrich W. Grabis, 58 Oakdale Ave., San Rafael, Calif. 94901

[21] Appl. No.: 154,977

[22] Filed: Feb. 9, 1988

[51] Int. Cl.$^4$ .............................................. G21C 11/00
[52] U.S. Cl. ................................ 250/515.1; 250/505.1
[58] Field of Search .............. 250/515.1, 505.1, 507.1, 250/517.1; 174/35 R; 361/424; 219/10.55 D

[56] References Cited

U.S. PATENT DOCUMENTS

| 3,964,072 | 6/1976 | White | 174/35 R |
| 4,631,641 | 12/1986 | Brombal et al. | 174/35 R |
| 4,647,714 | 3/1987 | Goto | 174/35 R |

FOREIGN PATENT DOCUMENTS 0101706  9/1976  Japan ................................. 250/515.1

Primary Examiner—Bruce C. Anderson
Assistant Examiner—Michael Aronoff
Attorney, Agent, or Firm—Flehr, Hohbach, Test, Albritton & Herbert

[57] ABSTRACT

An EMI/RFI radiation and static electricity suppression device for shielding radiation from various electronic and electrical sources. The suppression device includes a shielding membrane having the waveguide barrier with a multiplicity of protrusions facing the radiation emitting source for minimizing reflection of electromagnetic radiation incident thereupon. A plurality of conductive layers are each separated by spacers formed of a radiation absorbing media. The conductive layers include an inner-mesh disposed adjacent to the waveguide barrier and adapted for blocking low frequency radiation. A deflection layer formed of a multiplicity of spaced apart metallic deflection pads is provided for deflecting incident radiation thereabout. An absorption funneling layer disposed behind the deflection layer includes a plurality of apertures designed to receive the deflected radiation. A reflecting plate disposed behind the absorption funneling layer works in combination with the absorption funneling layer to trap radiation and cause its ultimate absorption in an absorptive region therein. Each of the conductive layers is connected to a common electrical ground. Impinging electromagnetic radiation emanating from a device may be effectively shielded with such a construction and electrostatic field build-ups are eliminated.

26 Claims, 5 Drawing Sheets

SHIELDING MEMBRANE

BACKGROUND OF THE INVENTION

The present invention relates generally to a device for shielding electromagnetic radiation emanating from electronic devices and electrical power sources. More particularly, the present invention relates to a shielding membrane that absorbs undesirable radiation emitted by cathode ray tubes, power sources and other electronic equipment systems.

In recent years, there has been a growing concern that extensive exposure to electromagnetic radiation and large electrostatic fields may have adverse implications to a person's health. With the continually increasing use of video display terminals and power supplies, there has been extensive research studying the effects of radiation and fields generated by such devices. During an international conference on "Working With Display Units" held in Stockholm, Sweden in May, 1986, evidence was presented showing a correlation between adverse health effects and extensive exposure to non-ionizing radiation emissions from the video display terminals. Additionally, some studies have shown that low frequency emissions from power lines located over residential areas have adverse health effects on people living in the region.

In addition to health concerns, such emissions may appear as noise to surrounding electronic equipment, thereby degrading the performance of neighboring equipment. Additionally, it has been shown that equipment can be readily constructed to detect radiation emitted from various computers and that the nature of data being worked with can be deciphered from an analysis of that radiation. Therefore, data security, particularly in the environment of embassies, banks and the like, has become a major concern. Therefore, there is a need for a device capable of effectively absorbing electromagnetic and RFI radiation as well as static electricity buildups.

In response to such concerns, there have been numerous devices developed for absorbing electromagnetic radiation. For example, in Japanese Patent Application No. 55-91870, an electromagnetic wave absorber is disclosed comprised of a plurality of foamed polystyrol members sandwiched between a metallic plate and a front surface having a plurality of pyramidal shaped foam surfaces created from the same material as the wave absorbing members. The polystyrol members serve as radiation absorbing media. However, the metallic layer reflects radiation incident thereon. Thus, even though a large thickness of wave absorbing members is used, there will be substantial reflection back through the sandwiched materials towards the radiation source. Unfortunately, such reflected radiation can have adverse effects on the operation of the electronic equipment. Particularly, such radiation may be picked up by the equipment as noise thereby adversely affecting performance. Therefore, it is extremely important to absorb most of the radiation within the shielding membrane.

Japanese Patent Application No. 55-29599 discloses an alternative embodiment of a wave absorber that comprises a plurality of triangular pyramid shape ferrite members disposed over ferrite plates that are backed with a metal plate. While such a device would effectively absorb some frequencies, its reliance upon wave length matching principles (due to its ferrite composition), restricts its usefulness to limited frequency ranges.

Therefore, there is a need for a shielding membrane that is easy to fabricate with inexpensive material, effectively absorbs a substantial percentage of the electromagnetic radiation incident thereupon over a wide frequency range, while passing virtually none of the radiation and reflecting only a small percentage of the radiation back into the region from which it originated.

SUMMARY OF THE INVENTION

Accordingly, it is a primary objective of the present invention to provide a shielding membrane capable of absorbing a substantial percentage of the electromagnetic and RFI radiation incident thereupon.

Another object of the invention is to provide a housing suitable for shielding users from radiation emitted by electronic appliances.

Another object of the present invention is to provide a shielding membrane that minimizes reflections back to a radiation source.

Another object of the invention is to provide a shielding membrane with a low radiation transmissivity.

To achieve the foregoing and other objects and in accordance with the purpose of the present invention, a shielding membrane is provided for shielding radiation from an electromagnetic radiation source. The shielding membrane has an incident surface facing the radiation source and a base surface facing away from the radiation source. The shielding membrane includes means for minimizing reflection of radiation directed onto the incident surface of the shielding membrane. Means is also provided for grounding some of the low frequency electrical components of the radiation. A conductive deflection layer, formed of a multiplicity of spaced-apart metallic deflection pads adapted to deflect incident radiation thereabout, is stacked behind the low frequency grounding means. A conductive absorption funneling layer is positioned spaced apart behind the deflection layer in a confronting relationship. The absorption funneling layer includes a multiplicity of apertures for passing radiation deflected about the deflection pads. A reflecting plate is placed near the base side of the absorption funneling layer. The low frequency grounding means, the deflection layer, the absorption funneling layer and the reflecting plate are each spaced apart and grounded to facilitate absorption of various components of the incident radiation. The gaps between these conductive layers are filled by spacers that are formed of an absorbing media to maximize radiation absorption. Preferably the spacers are formed of a high density porous foam.

The low frequency grounding means preferably includes a conductive mesh. The reflection minimizing means preferably includes a waveguide barrier having a multiplicity of protrusions facing the radiation emitting source. The protrusions are preferably pyramidal in shape and the waveguide barrier is preferably formed of a high density porous foam.

The apertures in the absorption funneling layer preferably have the same geometry as the deflection pads on the deflection layer. In a preferred method of construction, the apertures in the absorption funneling layer are stamped from a metallic foil and the cutout foil materials are used to form the deflection pads in the deflection layer.

Such a shielding membrane may be used to shield video display terminals, power supply stations, electronic equipment and the like. Additionally the walls of buildings and/or rooms, ships, aircraft, and other vehicles that require data and detection security could be constructed to incorporate such a shielding device.

BRIEF DESCRIPTION OF THE DRAWINGS

The features of the present invention that are believed to be novel are set forth with particularity in the appended claims. The invention, together with further objects and advantages thereof, may best be understood by reference to the following description taken in conjunction with the accompanying drawings in which:

DETAILED DESCRIPTION OF THE DRAWINGS

Figure 1:
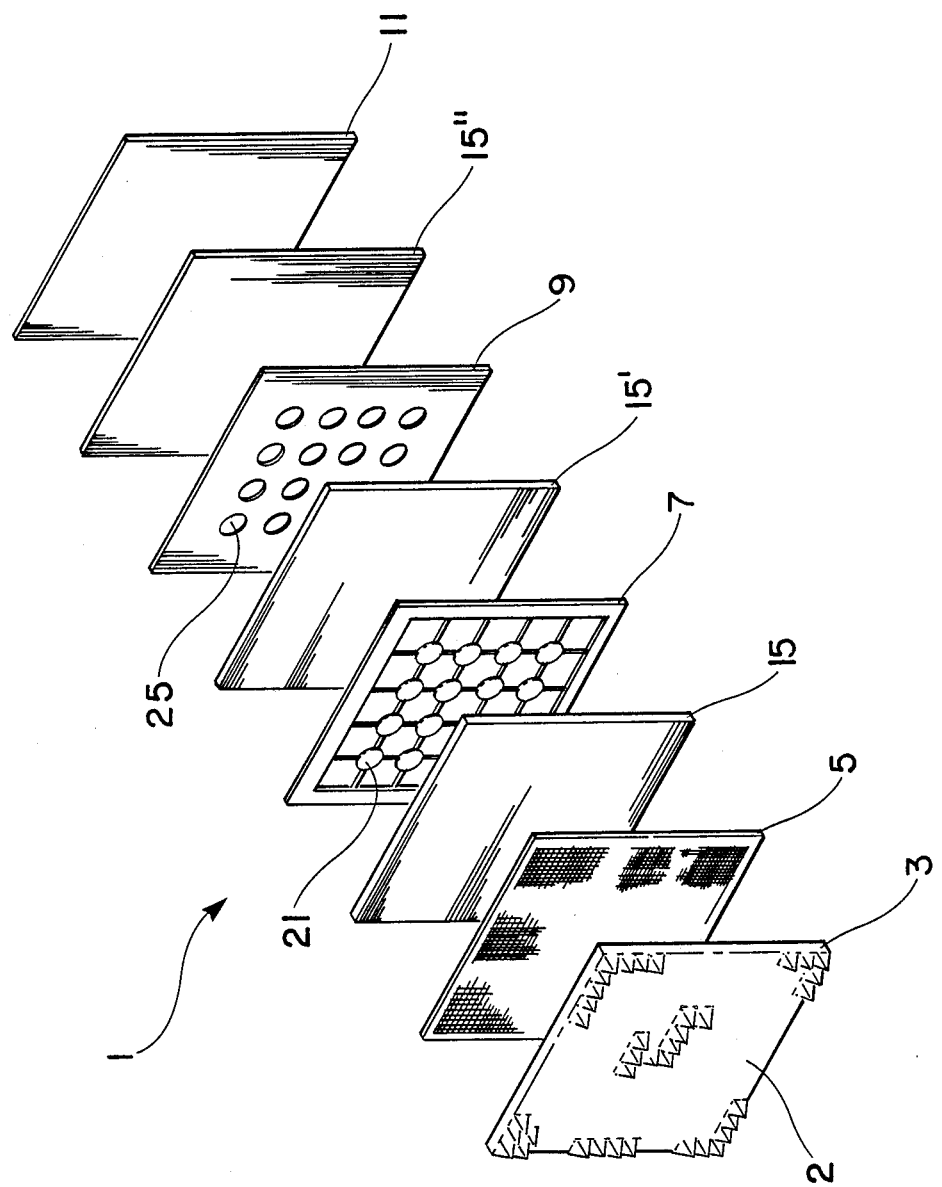
FIG. 1 is an exploded perspective view of a flat shielding membrane fabricated in accordance with the present invention.

As illustrated in the drawings, the shielding membrane 1 of the present invention includes a waveguide barrier 3, a mesh 5, a deflection layer 7, an absorption funneling layer 9, a reflecting plate 11, and a plurality of absorption spacers 15, 15', 15" formed from an appropriate absorption media. The mesh, the deflective layer, the absorption funneling layer and the reflecting plate (referred to herein as the conductive layers) are all formed of highly conductive materials and grounded and spacers 15, 15' and 15" are disposed therebetween to absorb and disperse as much of the incident radiation as possible. The shielding membrane described is designed to suppress radiation over an extremely broad frequency range including high frequency radiation near the visible light spectrum and extremely low frequency waves.

Referring first to FIG. 1, a preferred embodiment of the present invention will be described. The shielding membrane 1 has an incident surface 2 facing toward the components that emit radiation sought to be suppressed and a base surface. Waveguide barrier 3 forms the incident surface 2 of the shielding membrane 1. The waveguide includes a plurality of pyramid shaped protrusions that face toward the radiation emitting source (not shown). The shape of the protrusions may be varied somewhat, although they are intended to minimize radiation reflections from the incident surface of the shielding membrane 1 as described below with relation to FIG. 4. The waveguide barrier is formed from a radiation absorbing material preferably having micropores dispersed therethrough. The micropores are used advantageously to disperse radiation within the shielding membrane 1 which enhances the likelihood of absorption.

A mesh 5 formed of a highly electrically conductive material such as a conductive plastic or metal is disposed behind the waveguide barrier 3. By way of example, suitable metals include copper, aluminum, steel, conductively coated nylon or polyester, etc. Suitable plastics include foam and composites. The mesh is grounded and as will be appreciated by those familiar with antenna theory, the mesh will appear as a grounding plate to low frequency radiation. Therefore, a substantial percentage of the low frequency radiation incident upon conductive mesh 5 will be absorbed thereby. To secure the conductive mesh 5 in place, waveguide barrier 3 may be provided with and adhesive backing which adheres to the mesh 5. By way of example, a suitable adhesive is a 9000 Series type adhesive manufactured by 3M Company of St. Paul, Minn.

A deflection layer 7 formed of a plurality of electrically conductive deflection pads 21 is disposed on the base side of spacer 15. A spacer 15 formed of a radiation absorbing medium is disposed between the mesh 5 and the deflection layer 7 to separate the deflection layer and maintain a suitable distance therebetween. It should be appreciated that the actual spacing may be widely varied. By way of example, a ⅛" separation is appropriate. The deflection pads 21 are in electrical contact with one another and are suitably grounded. The electrical contact may be maintained by any suitable means including a conductive copper tape or a wire mesh. The deflection layer 7 is preferably formed of a metallic material such as copper, aluminum, stainless steel or nickel, (although other conductors are appropriate). The actual size of the deflection pads may be widely varied although, as explained below, they should be sized such that the expected incident radiation will deflect thereabout. The deflection pads may take any geometric shape. By way of example, a circular shape has been found to work well. Further by way of example, 2 cm. diameter disks work well for most applications. The deflection pads 21 must be spaced apart to work effectively. Experimentation has shown that a spacing of approximately one-fourth the disk diameter works well. Thus, for the 2 cm. diameter disks described above, a 0.5 cm. spacing works well. However, it should be appreciated that the actual size, shape and spacing of the deflection pads 21 may be widely varied. The actual size of the pads chosen for a particular function may be, in part, dependent on the wavelength of radiations sought to be suppressed.

Absorption funneling layer 9 includes a plurality of apertures 25 and is spaced apart from the deflection layer 7 on its base side. A second spacer 15' is disposed between the deflection layer 7 and the absorption funneling layer 9 to maintain the desired spacing. The spacing between absorption funneling layer 9 and deflection layer 7 is chosen to allow radiation deflected about the deflection pads 21 to recombine such that a substantial percentage of such radiation will regroup and pass through apertures 25. By way of example, a suitable separation is at least ⅛".

A reflecting plate 11 is positioned on the base side of the absorption funneling layer 9 with an appropriate spacer 15" disposed therebetween. The purpose of the reflective layer 11 is to reflect any incident radiation that is not absorbed thereon. The deflection layer 7, absorption funneling layer 9 and reflective plate 11 cooperate to trap entering radiation between the deflection layer and the reflective plate. A substantial portion of the trapped radiation is reflected back and forth between deflection layer 7 and the reflective plate until it is ultimately absorbed. Mesh 5, deflection layer 7, absorption funneling layer 9 and reflective plate 11 are all connected to appropriate grounds which may take the form of a common ground.

The spacers 15, 15' and 15" are all formed of a radiation absorbing media. As with the waveguide, desirable spacer properties include the ability to effectively absorb and disperse radiation incident thereon. A wide variety of suitable radiation absorbing materials are known to the art and, by way of example, a high density porous foam felt, fiberglass and the like all work well. Indeed, the spacers may be formed of either conductive or nonconductive material. By way of example, Soundfoam, manufactured by Soundfoam of Los Angeles, Calif. works well. The deflection pads, the absorption funneling layer and the reflective plate 11 are all preferably stippled to enhance defraction of radiation within the shielding membrane. It will be appreciated that defraction and dispersion of radiation within the shielding membrane increases the distance any particular wave must travel within the shielding membrane thereby increasing the likelihood that the wave will be absorbed and reducing the probability that the wave will be reflected back towards the source of electromagnetic radiation or transmitted through the shielding membrane.

Two of the principle objectives of the shield are to minimize reflections and to minimize transmissivity. Therefore, most of the incident radiation must be either absorbed or grounded by the shielding membrane. Conceptually, the shielding membrane 1 is broken down into several distinct regions. The first region (which comprises waveguide barrier 3) insures that, radiation incident on the shielding membrane is not reflected back towards the source of EM radiation. It is important to minimize the reflection of radiation back towards the source since such radiations may appear as noise to the source. The waveguide barrier 3, as well as the spacers 15, are formed from a media that absorbs and disperses radiation passing therethrough. Dispersion of the radiation is important since it statistically increases the likelihood that incident radiation will be either absorbed or grounded within the shielding membrane. Therefore, the waveguide barrier acts as both an initial reflection minimizing zone and as an absorption and dispersion zone.

Figure 2:
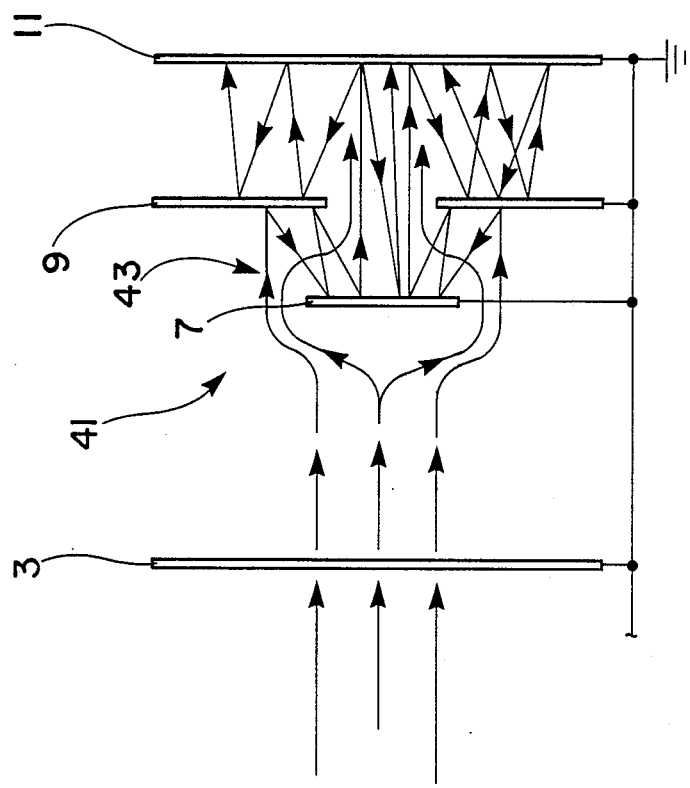
FIG. 2 is a schematic side view of the shielding membrane shown in FIG. 1 highlighting the travel of an incident wave within the shielding membrane.

Referring next to FIG. 2, the travel of waves that have entered through waveguide barrier 3 will be described. The mesh 5 acts as a grounding zone for low frequency radiation. As will be appreciated by those familiar with antenna design a wire mesh will effectively ground much of the incident low frequency radiation. Higher frequency radiation (and lower frequency radiation that escapes the mesh) passes through an absorption spacer into a trap region comprising the deflection layer 7, absorption funneling layer 9, and reflecting plate 11. The intent of the trap region is to "capture" a substantial portion of the incident radiation behind the deflection and preferably the absorption funneling layer to ensure that it is absorbed rather than reflected back towards the radiation source or transmitted outside the shield.

Some of the radiation directed towards the deflection pads 21 will actually strike the pads and become grounded. However, most radiation will be diverted about the grounded metallic deflection pads. Thus, the deflection pads create a deflection zone 41. Radiation that passes through the deflection zone 41 travels into a funneling zone 43 which directs the radiation through apertures 25 in absorption funneling layer 9. The radiation tend to regroup after it passes the deflection pads and pass through the apertures 25 in absorption funneling layer 9. Such regrouping is important to the function of the trap, since the intent is to have radiation deflected about the deflection pads 21 pass through the apertures 25. Therefore, it is important that the absorption funneling layer be spaced far enough behind the deflection pads to allow the radiation to regroup and divert through the apertures 25. Radiation that does not pass through the absorption funneling layer will be defracted and will tend to bounce back and forth between deflection pads 21 and absorption funneling layer 9 until it either bounces through an aperture 25 or is absorbed by the conducting layers 7 and 9 or the adjacent spacers. The deflector pads need not be lined up with the apertures of the funneling layer for proper absorption to take place. This is particularly true in cases where the incident radiation is not perpendicular to the membrane. It should be appreciated that radiation escaping the trap region will likely be absorbed by mesh layer 5, its adjacent spacers, or waveguide barrier 3.

After passing through the funneling zone the waves pass into a second absorption zone disposed between the absorption funneling layer and the reflecting plate 11. The intent is to trap as much of the radiation as possible between the reflective plate 11 and the deflection layer 7 and to cause the radiation trapped therein to bounce back and forth between the reflecting plate and the absorption funneling layer until it is absorbed. The described construction proves to be very effective at retaining radiation within the second absorption zone long enough for it to be either absorbed by spacer 15 or grounded by one of the conductive layers.

It will be appreciated that some radiation will actually be absorbed and/or dispersed by waveguide 3 and spacers 15 and 15'. Additionally, some radiation will be grounded by deflection layer 7 or by striking the front surface of the absorption funneling layer.

Figure 3:
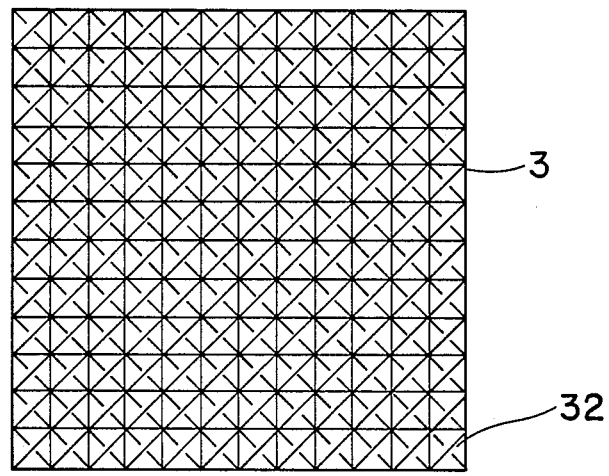
FIG. 3 is a front view of a shielding membrane seen in FIG. 1.

Referring next to FIG. 3, the waveguide barrier 3 will be described. The waveguide includes a plurality of pyramid shaped protrusions 32 that face toward the radiation emitting source (not shown). The shape of the protrusions may be varied somewhat, although they are intended to minimize radiation reflections from the incident surface of the shielding membrane 1. The waveguide barrier 3 is formed from a radiation absorbing material preferably having micropores dispersed therethrough. The micropores are used advantageously to disperse radiation within the shielding membrane 1 which enhances the likelihood of absorption. A wide variety of suitable radiation absorbing materials are known to the art and by way of example, a high density porous foam works well for this purpose. A suitable high density foam is Soundfoam, manufactured by Soundfoam of Los Angeles, Calif. Other suitable materials include felt, fiberglass and the like.

Figure 4:
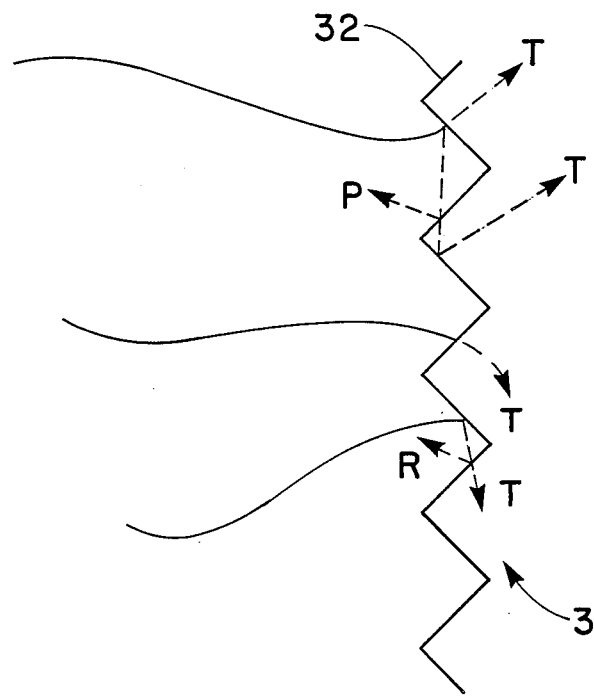
FIG. 4 is a schematic of the reflection and transmission characteristic of a waveguide barrier in accordance with the present invention.

Referring next to FIG. 4, the reflection and transmission characteristics of a waveguide barrier 3 constructed in accordance with the present invention will be described. As indicated above, the waveguide barrier includes a multiplicity of pyramidal shaped protrusions that face the radiation emitting source. Such a shape reduces the likelihood of reflecting radiation back toward the radiation source. The pyramidal geometry facilitates increased absorption since radiation reflected off of the incident surface 2 is likely to be reflected toward another portion of the waveguide barrier 3 wherein it may be absorbed on its second or third contact. The advantages of such a construction is well known to the prior art. It is important to minimize reflections since such radiation constitutes noise which in many circumstances can be extremely problematic for the electronics.

Figure 5:
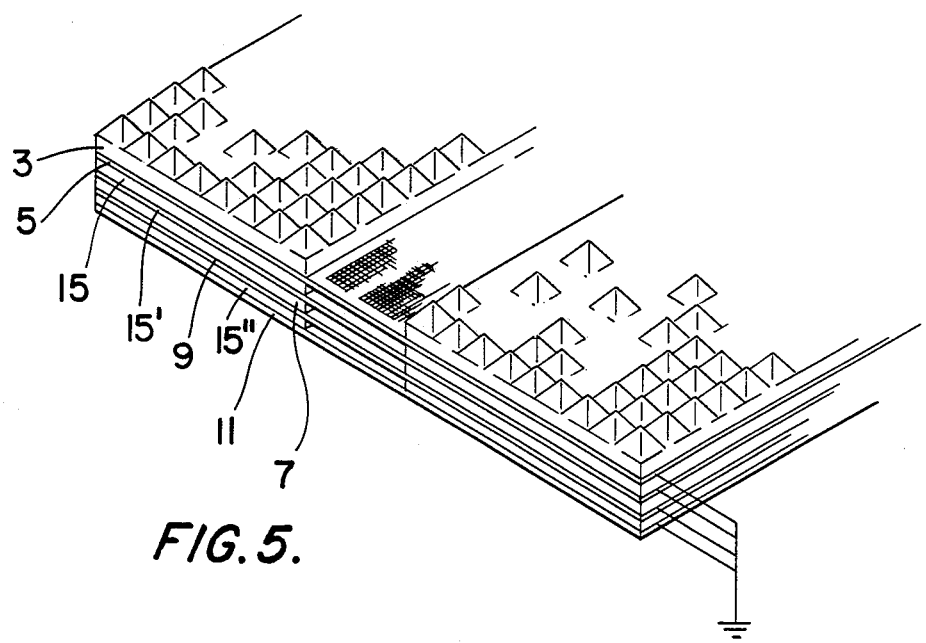
FIG. 5 is a perspective view of the shielding membrane shown in FIG. 1.
Figure 6:
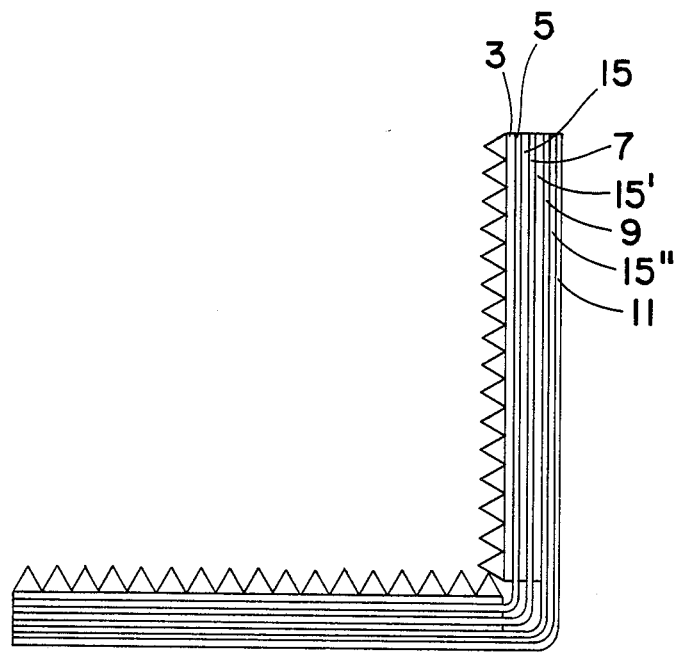
FIG. 6 is a side view of the shielding membrane shown in FIG. 1 as applied to a corner section.

Referring next to FIGS. 5 and 6, the interconnection of membrane sections and the formation of corners will be described. Membrane sections may be interlinked by using continuous conducting layers including conductive mesh 5, deflection layer 7, absorption funneling layer 9 and reflective layer 11. The waveguide barrier and the spacers may be sized appropriately to conform to the walls of a housing. To form a corner, two adjoining sections are bent upon another as shown in FIG. 6 such that the respective waveguide barriers 3 contact one another. Such a continuous construction minimizes the possibility of both reflection back toward the electrical components and emissions of radiation from the appliance. As is schematically illustrated in FIG. 5, each of the conducting layers may be joined to a common ground. On membrane structures under $\frac{1}{2}$" in aggregate sandwich thickness, the spacers do not have to be cut for corner bending as long as they stretch sufficiently to accommodate the extra distance required.

The sandwich construction described may be manufactured in a laminated form, as individual components or in other suitable forms. In one of the preferred embodiments, a metallic foil sheet may be used to form absorption funneling layer 9, with the apertures 25 being punched therefrom. The punched portions of the metallic foil may be used to form the deflection pads 21. Thus, conceptually, the stamped portions of the absorption funneling layer are moved forward and electrically connected by suitable means such as copper or other conductive tape or wire.

Figure 7:
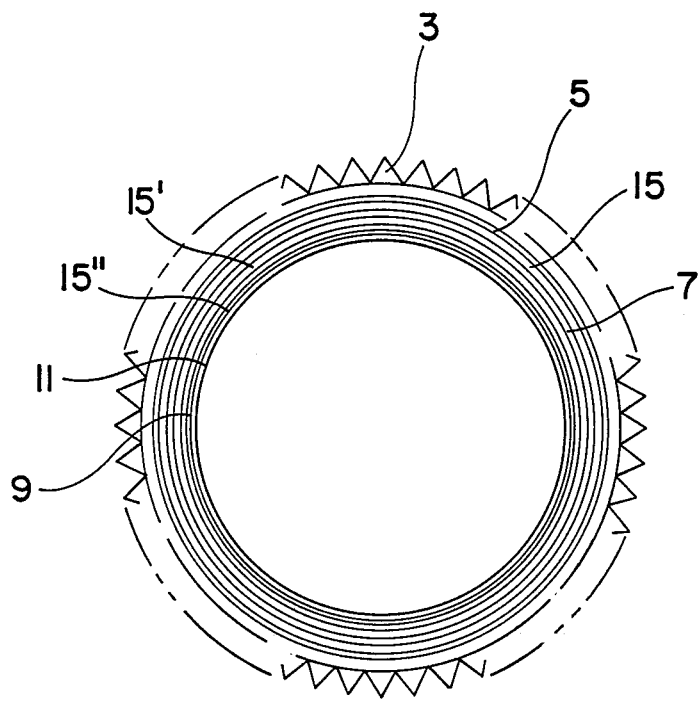
FIG. 7 is a perspective view of a tubular construction of the shielding membrane.

Referring next to FIG. 7, the shielding membrane may be fabricated in a tubular construction. Such a tubular configuration lends itself ideally to the shielding of power lines, conduits and the like.

By way of example the application of a shielding membrane to the plastic casing walls of a video display terminal will be described. A thin layer of adhesive is applied to the back surface of the reflecting plate as uniformly as possible. The shielding layer is then adhered to the casing wall. Alternatively, the shielding membrane 1 may be integrated into the housing of an electrical appliance.

Although only one embodiment of the present invention has been described in detail, it should be understood that the present invention may be embodied in many other specific forms without departing from the spirit or scope of the invention. Particularly, it should be appreciated that additional absorption or grounding layers could be added to further reduce reflections or transmissivity. Similarly, multiple defraction/absorption funneling component pairs may be added to improve the efficiency of the shielding membrane. It should also be appreciated that there are a wide variety of materials that can be used for each of the components. For example, the waveguide barrier and spacers may be formed from high density foams, felt, fiberglass or even particle board. The various conducting layers should all be highly conductive, such as metal mesh and foils. Copper, nickel, steel and aluminum are good examples. In an application designed specifically for shielding X-rays, the conductive layers 5, 7 9 and 11 may be formed of lead. Such a construction would greatly reduce the weight of conventional shielding aprons necessary to protect against X-rays. It will be appreciated that the multi-layer structure of spaced conductive layers obviates the need for an individual conductive barrier layer that is very thick as is commonly necessary in conventional single layer X-ray barriers.

Additionally, it will be understood by those skilled in the art that a shielding membrane as disclosed herein has many applications beyond housings for cathode ray tubes and electronic components as described herein. For example, such a shield arrangement could be built into the walls of power stations to reduce the fields generated therein. Further, installations which have concerns about the security of data may include walls formed with the described shielding membrane to prevent the escape of radiation. Similarly vehicles and installations can be shielded from electronic jamming with such a membrane. It should also be appreciated that the shielding membrane of the present invention may be used to attenuate certain electromagnetic fields. This is accomplished by suppressing the electrical components of such fields. Therefore, the present examples of embodiments are to be considered as illustrative and not restrictive, and the invention is not to be limited to the details given herein, but may be modified within the scope of the appended claims.

I claim:

1. A shielding membrane for absorbing radiation generated by an electromagnetic radiation source, the shielding membranes comprising:

first means for absorbing some of the radiation initially passing into the membrane;

second means for grounding some of the low frequency components of the radiation that is not absorbed by said first means;

third means for trapping, grounding and absorbing still further radiation not absorbed or grounded by said first and second means, said third means including an electromagnetic radiation absorption media, the third means further causing at least a portion of the unabsorbed radiation to reflect back and forth through the absorption media.

2. A shielding membrane as recited in claim 1 wherein said third means includes a pair of grounded plates positioned in a spaced apart confronting relationship on opposite sides of the absorption media for reflecting at least a portion of the unabsorbed radiation incident thereon back and forth across the absorption media.

3. A shielding membrane as recited in claim 1 wherein said first means includes means for minimizing reflections of electromagnetic radiation incident on the shielding membrane.

4. A shielding membrane for absorbing radiation from an electromagnetic radiation source, the shielding membrane having an incident side facing substantially towards the radiation source and a base side facing substantially away from the radiation source, the shielding membrane comprising:

means for minimizing reflection of electromagnetic radiation incident on the incident surface of the shielding membrane;

a conductive deflection layer formed of a multiplicity of spaced apart metallic deflection pads for deflecting incident radiation thereabout, said deflection layer being positioned in spaced apart confronting relationship with the base side of said reflection minimizing means;

a conductive absorption funneling layer disposed in spaced apart confronting relationship with the base side of the deflection layer and having a multiplicity of apertures for passing radiation; and a grounded reflecting plate spaced apart from the base side of said absorption funneling layer.

5. A shielding membrane as recited in claim 4 further comprising means for grounding some of the low frequency components of the radiation that enters the shielding membrane, the low frequency grounding means being disposed between the reflection minimizing means and the deflection layer.

6. A shielding membrane as recited in claim 5 wherein said grounding means includes a conductive mesh that is spaced apart from said deflection layer, the mesh being grounded.

7. A shielding membrane as recited in claim 6 wherein said reflection minimizing means includes a waveguide barrier having a multiplicity of protrusion facing the radiation emitting source for minimizing reflection of electromagnetic radiation incident on the shielding membrane.

8. A shielding membrane as recited in claim 7 further comprising a first spacer disposed between said conductive mesh and said deflection layer, a second spacer disposed between said deflection layer and said absorption funneling layer and a third spacer disposed between said absorption funneling layer and said reflecting plate.

9. A shielding membrane as recited in claim 8 further comprising a plurality of deflection layers and a plurality of absorption funneling layers disposed in spaced apart relation between said conductive mesh and said reflecting plate.

10. A shielding membrane as recited in claim 4 wherein said reflecting plate is formed of a metallic material.

11. A shielding membrane as recited in claim 8 wherein said spacers are formed of a high density porous foam.

12. A shielding membrane as recited in claim 5 wherein the deflection pads on said deflection layer have substantially the same geometry as the apertures on said absorption funneling layer.

13. A shielding membrane as recited in claim 12 wherein said deflection pads are substantially circular and electrically interconnected.

14. A shielding membrane as recited in claim 8 for use in the walls of a building.

15. A shielding membrane as recited in claim 8 wherein said conductive layers are formed of lead and said radiation source emits X-rays.

16. A shielding membrane as recited in claim 8 wherein said shielding membrane forms a portion of a housing for a video display terminal.

17. A shielding membrane as recited in claim 8 wherein said shielding membrane forms a housing disposed about a power supply or radiation source.

18. A shielding membrane as recited in claim 8 wherein said shielding membrane is substantially tubular.

19. A shielding membrane as recited in claim 18 wherein said shielding membrane is disposed about electrical power lines.

20. A shielding membrane as recited in claim 7 wherein said waveguide barrier protrusions are substantially pyramidal.

21. A shielding membrane as recited in claim 8 wherein said deflection layer, said absorption funneling layer and said reflecting plate are all stippled to disperse radiation reflected therefrom.

22. A housing for shielding the emission of an appliance having components that emit electromagnetic radiation, the housing having an incident side facing substantially towards the radiation emitting components and a base surface facing substantially away from the radiation emitting components, the housing comprising:

a waveguide barrier having a multiplicity of substantially pyramid shape protrusions facing the radiation emitting components for minimizing reflection of electromagnetic radiation incident on the shielding membrane;

a conductive mesh disposed on the base side of the waveguide barrier for blocking low frequency radiation, said mesh being grounded;

a conductive deflection layer formed of a multiplicity of spaced apart metallic deflection pads for deflecting incident radiation thereabout, said deflection layer being grounded and positioned in spaced apart relation from the base side of said conductive mesh;

a conductive absorption funneling layer disposed in spaced apart confronting relationship with the base side of the deflection layer and having a multiplicity of apertures for passing radiation, said absorption funneling layer being grounded;

a reflecting plate spaced apart from the base side of said absorption funneling layer; and a plastic casing disposed on the base side of the reflecting plate; and a plurality of absorption spacers adapted to absorb and disperse at least a portion of the radiation incident thereon, the plurality of absorption spacers including a first spacer disposed between said conductive layer and said deflection layer, a second spacer disposed between the deflection layer and the absorption funneling layer, and a third spacer disposed between said absorption funneling layer and said reflecting plate.

23. A shielding membrane for shielding radiation from various electronic and electrical sources, the shielding membrane having an incident side facing said components and a base side facing away from said components, the shielding membrane comprising:

a waveguide barrier having a multiplicity of pyramidal protrusions facing the radiation source for minimizing the reflection of electromagnetic radiation incident thereupon;

a plurality of spaced apart and stacked conductive layers, each said conductive layer being grounded for grounding a portion of the incident radiation;

a plurality of absorption spacers for absorbing and dispersing radiation passing therethrough, each said absorption spacer being disposed between an adjacent pair of conductive layers; and wherein said conductive layers include, a conductive mesh adapted to block low frequency radiation, a deflection layer formed of a multiplicity of spaced apart electrically connected metallic deflection pads for deflecting incident radiation thereabout, an absorption funneling layer disposed on the base side of said deflection pad and having a multiplicity of apertures for passing radiation deflected about said deflection pads, and a reflecting plate disposed on the base side of said absorption funneling layer for cooperating with said absorption funneling layer and said deflection layer to trap radiation passing through said apertures therebetween.

24. A shielding membrane as recited in claim 4 wherein said deflection layer is grounded.

25. A shielding membrane as recited in claim 4 wherein said absorption funneling layer is grounded.

26. A shielding membrane for absorbing radiation from an electromagnetic radiation source, the shielding membrane having an incident side facing substantially towards the radiation source and a base side facing substantially away from the radiation source and comprising:

a conductive deflection layer formed of a multiplicity of spaced apart metallic deflection pads for deflecting incident radiation thereabout;

a conductive absorption funneling layer disposed in space apart confronting relationship with the base side of the deflection layer and having a multiplicity of apertures for passing radiation;

absorption means for absorbing radiation passing through said shielding membrane, said absorption means including a first absorption layer disposed on the incident side of said deflection layer and a second absorption layer disposed between said deflection and absorption funneling layers; and grounding means for grounding at least one of the conducting layers from a group including the deflection and absorption funneling layers.

* * * * *